US 6,307,396 B1

(12) United States Patent
Mulatti et al.

(10) Patent No.: US 6,307,396 B1
(45) Date of Patent: Oct. 23, 2001

(54) LOW-CONSUMPTION TTL-CMOS INPUT BUFFER STAGE

(75) Inventors: Jacopo Mulatti, Latisana; Marco Maccarrone, Palestro; Ignazio Martines, Termini Imerese; Rino Micheloni, Turate, all of (IT)

(73) Assignee: STMicroelectronic S.r.l., Agrate Brianza (IT)

( * ) Notice: Subject to any disclaimer, the term of this patent is extended or adjusted under 35 U.S.C. 154(b) by 0 days.

(21) Appl. No.: 09/231,130

(22) Filed: Dec. 30, 1998

(30) Foreign Application Priority Data

Dec. 31, 1997 (EP) .................................... 97830743

(51) Int. Cl.[7] ............................................. H03K 19/0185
(52) U.S. Cl. .................. 326/71; 326/82; 326/58; 326/83; 326/68
(58) Field of Search ..................... 326/63, 68, 69, 326/70, 71, 83, 56, 57, 82

(56) References Cited

U.S. PATENT DOCUMENTS

| 4,437,024 | 3/1984 | Wacyk . | |
|---|---|---|---|
| 4,469,959 | * 9/1984 | Luke et al. | 326/63 |
| 4,642,488 | * 2/1987 | Parker | 326/63 |
| 4,929,853 | * 5/1990 | Kim et al. | 326/63 |
| 5,144,167 | * 9/1992 | McClintock | 326/63 |
| 5,151,620 | 9/1992 | Lin . | |
| 5,341,046 | * 8/1994 | Crafts | 326/83 |
| 5,614,847 | 3/1997 | Kawahara et al. | 326/98 |

FOREIGN PATENT DOCUMENTS

| 595318 A2 | 5/1994 | (EP) . |
| 621694 A2 | 10/1994 | (EP) . |
| 05304464 A | 11/1993 | (JP) . |

* cited by examiner

Primary Examiner—Michael Tokar
Assistant Examiner—Don Phu Le
(74) Attorney, Agent, or Firm—Robert Iannucci; Seed IP Law Group, PLLC

(57) ABSTRACT

A low-consumption TTL-CMOS input buffer stage includes a chain of inverters cascade connected between an input receiving electric signals at a TTL logic level and an output reproducing electric signals at a CMOS logic level, and powered between a first or supply voltage reference and a second or ground reference. Advantageously, the first inverter in the chain includes a means of selecting the delivery path to the stage according to an activate signal for a low-consumption operation mode. In essence, the first inverter of the buffer has two signal paths: one for normal operation and the other for low consumption operation.

17 Claims, 6 Drawing Sheets

LOW-CONSUMPTION TTL-CMOS INPUT BUFFER STAGE

TECHNICAL FIELD

This invention relates to a novel configuration of an input buffer which is capable of effecting conversions between TTL and CMOS logic levels, while complying with low supply consumption specifications.

More particularly, the invention relates to a low-consumption TTL-CMOS input buffer stage of the type which comprises a chain of inverters cascade connected between an input, receiving electric signals at a TTL logic level, and an output reproducing electric signals at a CMOS logic level the inverters being powered between a first or supply voltage reference and a second or ground reference.

BACKGROUND OF THE INVENTION

As those skilled in the art will recognize, many electronic circuits integrated by CMOS technology require that electric signals at a TTL logic level are received as input from TTL logic circuitry.

In each CMOS circuit having TTL inputs, the input buffer stage is asked to effect a conversion of logic levels. As a result of this conversion, the internal circuitry will receive signals which are purely CMOS but logically congruous with the TTL inputs of the integrated circuit.

In this respect, it should be remembered that, in TTL logics, an input signal is regarded to have a "low" logic value if the signal amplitude is less than 0.8V, and to have a "high" logic value if the signal amplitude exceeds 2.0V.

These conditions must be complied with regardless of the internal supply voltage of the input buffer.

The accompanying FIG. 1 shows a circuit diagram of a conventional input buffer stage 1 for TTL-CMOS conversion, in its simplest form.

The buffer 1 is basically formed by a chain of inverters which are all supplied by same device internal supply voltage Vcc. The aspect ratio of the first inverter 2 in the chain is unbalanced to lower its threshold, while the last two inverters in the chain, indicated with 3 and 4, have an aspect ratio of (Wp/Lp)/(Wn/Ln)=2 to ensure that the rising and falling edges of the output signal OUT, to be passed to downstream circuitry, will be identical.

It should be noted that the changeover threshold of the circuit 1 in FIG. 1 increases linearly with the supply voltage Vcc, as shown in FIG. 1A. Furthermore, the threshold sweep, for a sweep Δ of the voltage V, is bound to be Δ/2 regardless of the aspect ratii of the inverters in the chain.

This feature restricts the margin for noise of the structure with a high input. In fact, this margin is by definition:

$$NM_H = 2.0 - V_{Th(Vcc)}$$

and, therefore, mini while Vcc is at a maximum.

But the structure shown in FIG. 1 has another problem: it has been found that, for a TTL input, the NMOS and PMOS transistors of the first inverter 2 are both in the 'on' state. This means that, while still ensuring that the circuit output OUT is at its specified logic level, a high current consumption occurs, especially when the supply voltage Vcc is at the highest value provided for by the specifications.

A typical static consumption of tens of microamperes has been found for a single buffer. This consumption is unacceptable, especially in circuits that are to be incorporated into low-power amplifiers which often require that, following a time latency of the inputs, the circuit goes to a standby state of low consumption and is prepared for a new switching.

The state of the art proposes a second solution to fill the demand for TTL-CMOS conversion. Shown schematically in FIG. 2 is an input buffer stage 5 which is again configured as an inverter chain and includes a current generator 6 for controlling the switching threshold in a high supply voltage situation.

While being in many ways advantageous, not even this solution is entirely satisfactory, again by reason of its excessively high consumption.

In fact, the first inverter 7 in the chain is supplied the voltage Vcc through a PMOS transistor M1 connected to the current generator 6. Since the current through the first inverter 7 is limited by M1, especially at high supply voltages, the rise in the switching threshold will be reduced even as Vcc increases, as shown in FIG. 2A. Thus, the margin for noise is improved in the circuit 5.

However, the static consumption of the bias network of the gate terminal of the transistor M1 adds to that of the inverter chain.

SUMMARY OF THE INVENTION

An embodiment of this invention provides a novel structure of a TTL-CMOS input buffer stage which has such constructional and functional features as to ensure lower consumption than the solutions proposed by the prior art.

This allows incorporation of the input buffer stage to any types of CMOS circuits requiring conversion from TTL logic levels and being intended for low-power applications.

The embodiment has the first inverter in the buffer sized symmetrically with its pull-up and pull-down portions, and further providing two signal paths, one for normal operation and the other for low-consumption operation.

The features and advantages of a buffer stage according to this invention will be apparent from the following description of an embodiment thereof, given by way of non-limitative example with reference to the accompanying drawings.

DETAILED DESCRIPTION

Figure 3:
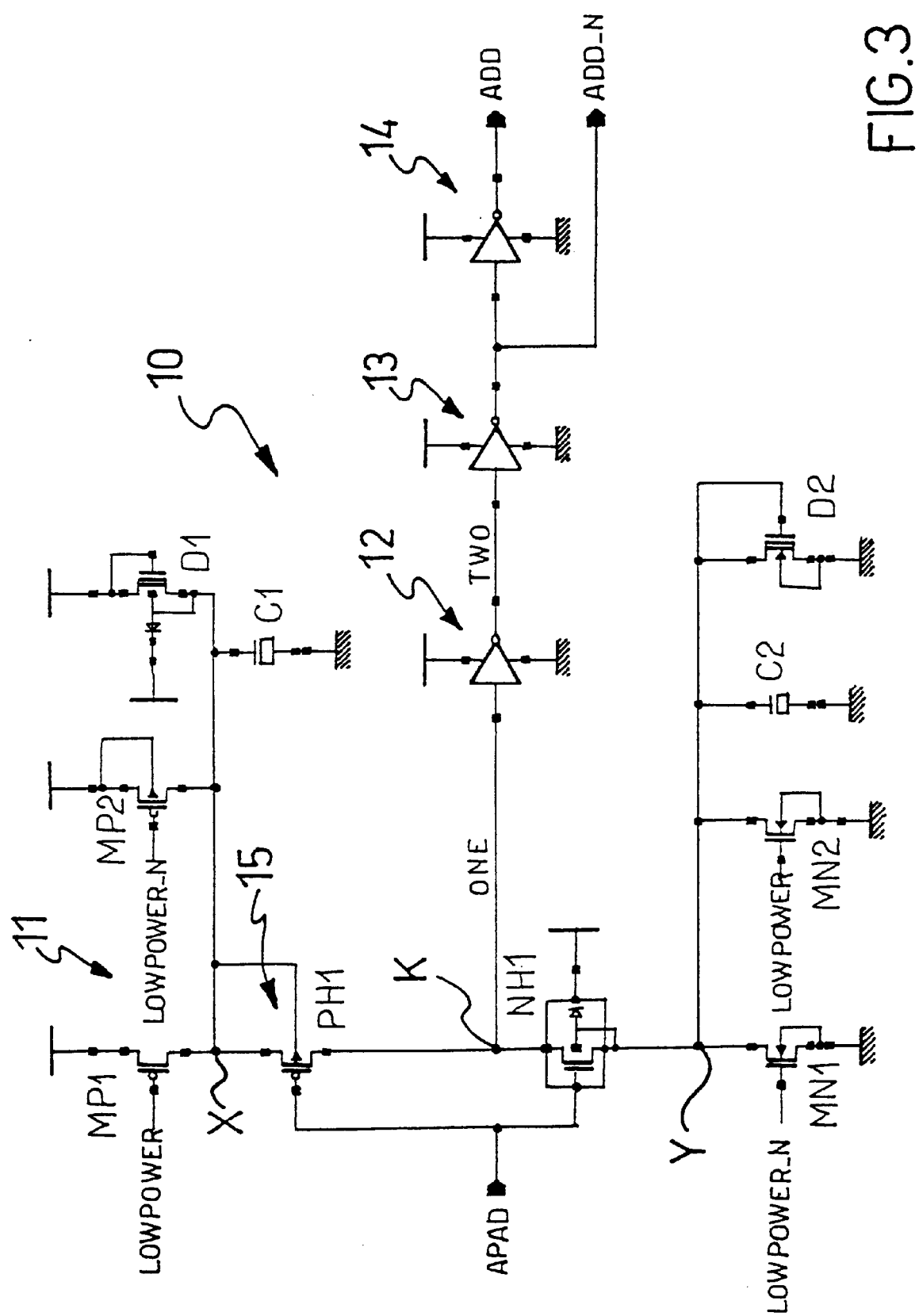
FIG. 3 shows diagramatically a TTL-CMOS input buffer stage according to this invention.

Referring to the drawing figures and specifically to the example of FIG. 3, generally and schematically shown at 10 is a TTL-CMOS input buffer stage according to this invention which is intended for conversion between TTL and CMOS logic levels, as well as to comply with specifications of power supply low-consumption.

The stage 10 comprises essentially a chain of cascade connected inverters.

More particularly, the chain is made up of four cascaded inverters, as respectively indicated at 11, 12, 13 and 14, an input APAD at a TTL logic level, and an output ADD at a CMOS logic level.

An inverted output signal ADD_N is picked up between the third and fourth inverters, 13 and 14.

Figure 1A:
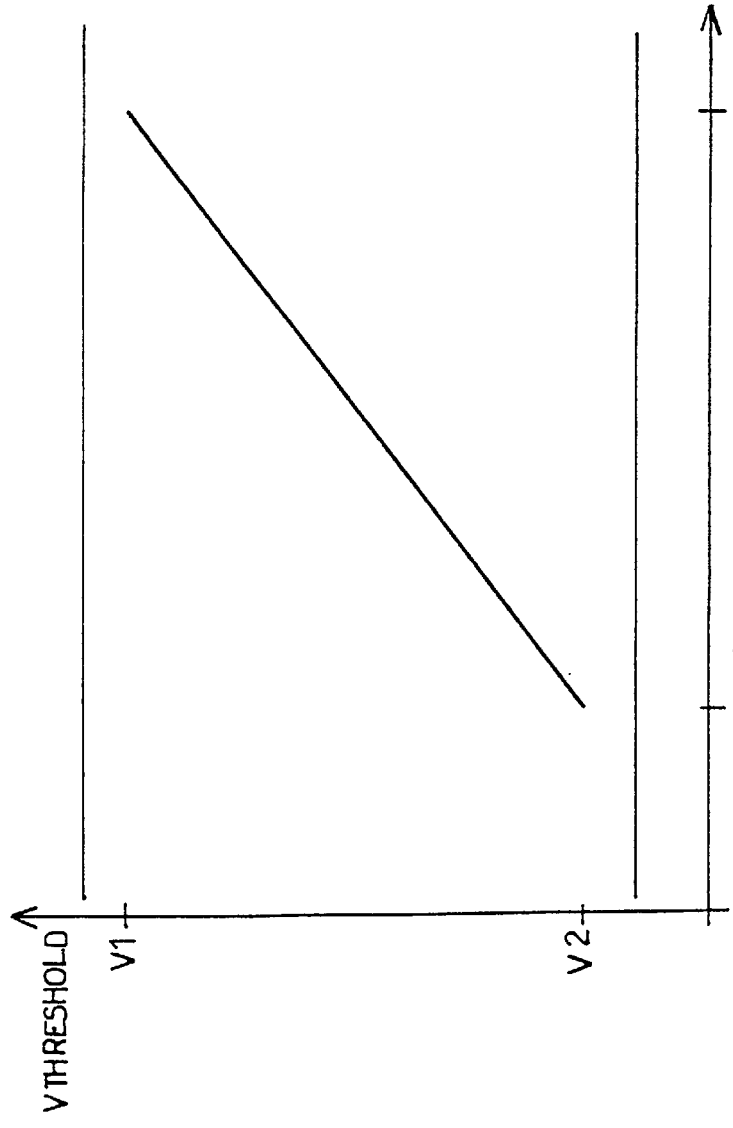
FIG. 1A is a voltage vs. voltage plot of the ratio of threshold voltage to supply voltage for the buffer stage in FIG. 1.
Figure 1:
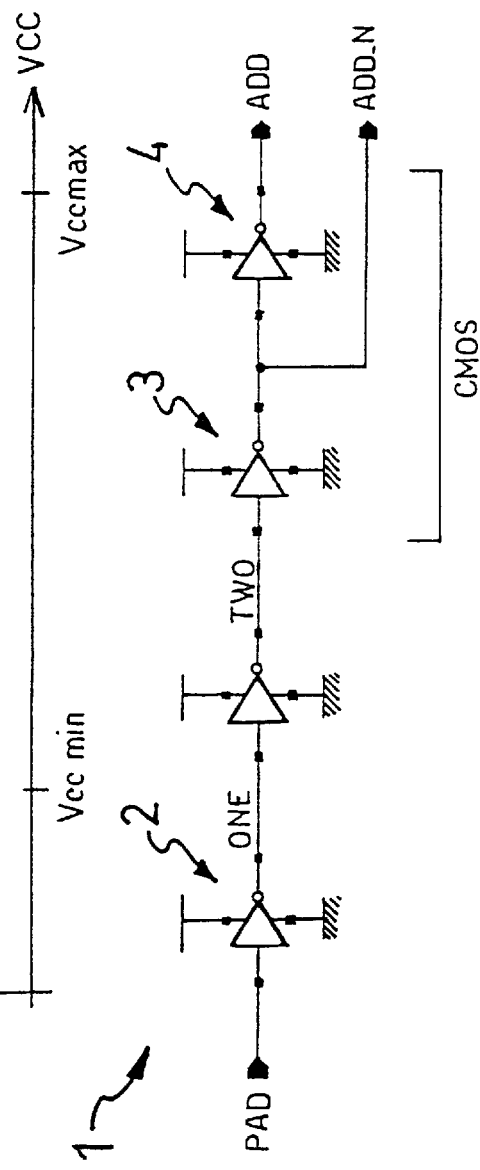
FIG. 1 shows diagramatically a TTL-CMOS input buffer stage according to the prior art.
Figure 2A:
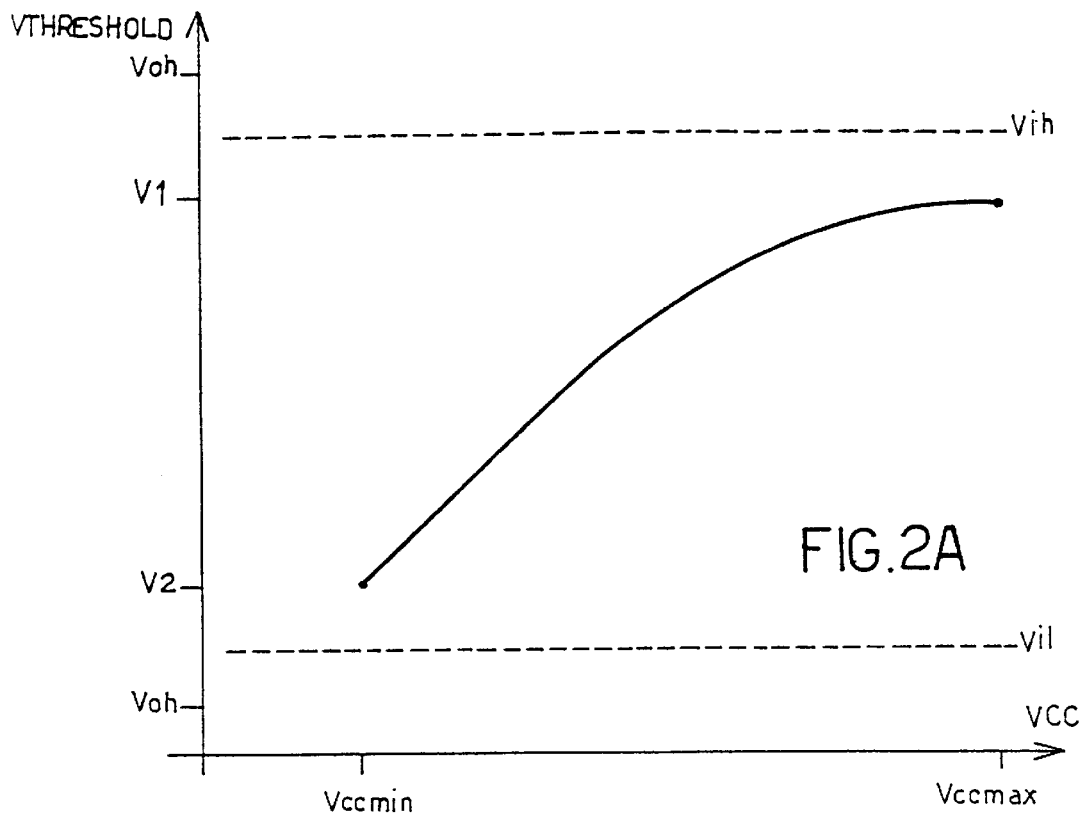
FIG. 2A is a voltage vs. voltage plot of the ratio of threshold voltage to supply voltage for the buffer stage in FIG. 2.
Figure 2:
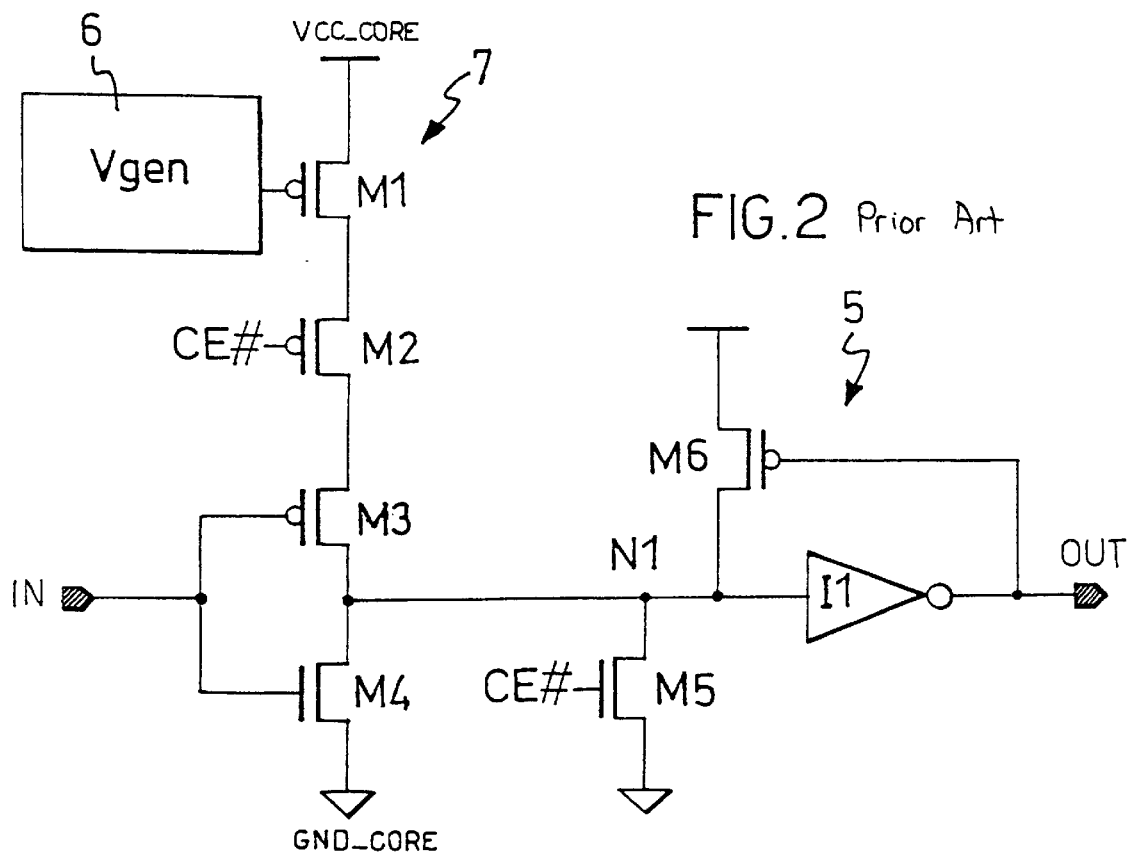
FIG. 2 shows diagramatically a second embodiment of a TTL-CMOS input buffer stage according to the prior art.

The last two, 13 and 14, of the inverters are constructed with aspect ratii of the PMOS and NMOS transistors which are given as:

$$(Wp/Lp)/(Wn/Ln)=2$$

in order to ensure that the rising and falling edges of the output signals will be identical with each other. This feature is the same as provided in the conventional structure of FIG. 1.

Advantageously, the first inverter 11 of the chain has a peculiar structure in the stage 10 of this invention.

The first inverter 11 comprises a PMOS switch MP1 and an NMOS transistor MN1 which are connected in series with each other between a first or supply voltage reference Vcc and a second or ground reference GND.

The gate terminal of the PMOS transistor MP1 receives a control signal LOWPOWER, while the gate terminal of the NMOS transistor MN1 receives the same signal in its negated form, LOWPOWER_N.

Connected between said transistors MP1 and MN1 is an inverter 15 formed of a complementary pair of high voltage transistors PH1 and NH1.

The gate terminals of these transistors PH1, NH1 are connected together at the common input terminal APAD.

The transistor MH1 has respective source and body terminals connected to the Y node and an n-well region connected to the voltage supply Vcc.

The node K interconnecting the transistors PH1 and MH1 is connected to the input of the second inverter 12 in the chain that includes the buffer 10.

The two PMOS transistors MP1 and PH1—which are located in the switch portion of the inverter 11—are interconnected at a node X. The body terminal of the transistor PH1 is connected to the node X.

The node X is connected to the voltage supply Vcc through a parallel of:
  a high-voltage PMOS transistor MP2 receiving the signal LOWPOWER_N on its gate terminal; and
  a diode D1 provided by a triple-well low-threshold native transistor.

Furthermore, the node X is connected to ground through a capacitor C1.

The two NMOS transistors MN1 and MH1—which are located in the switch portion of the inverter 11, relative to the node K—are interconnected at a node Y.

The node Y is connected to the ground GND through a parallel of:
  a high-voltage NMOS transistor MN2 receiving the signal LOWPOWER on its gate terminal;
  a diode D2 provided by a low-threshold native transistor; and
  a capacitor C2.

Advantageously, the transistors that comprise the first inverter 11 are formed in separate wells from the other inverters in the chain.

Figure 4:
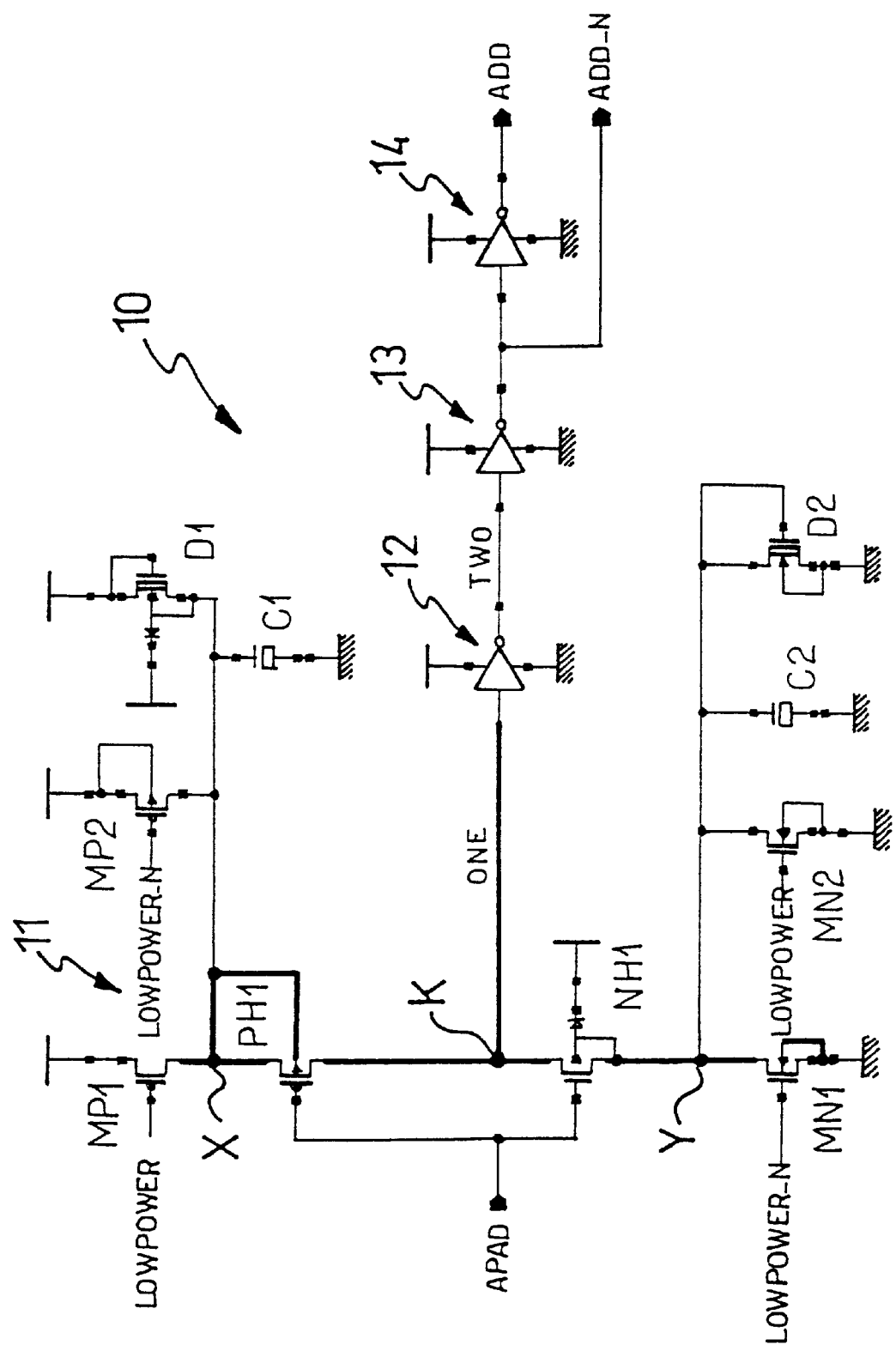
FIGS. 4 and 5 are respective diagrams showing the buffer stage of FIG. 3 in two different conditions of its operation.
Figure 5:
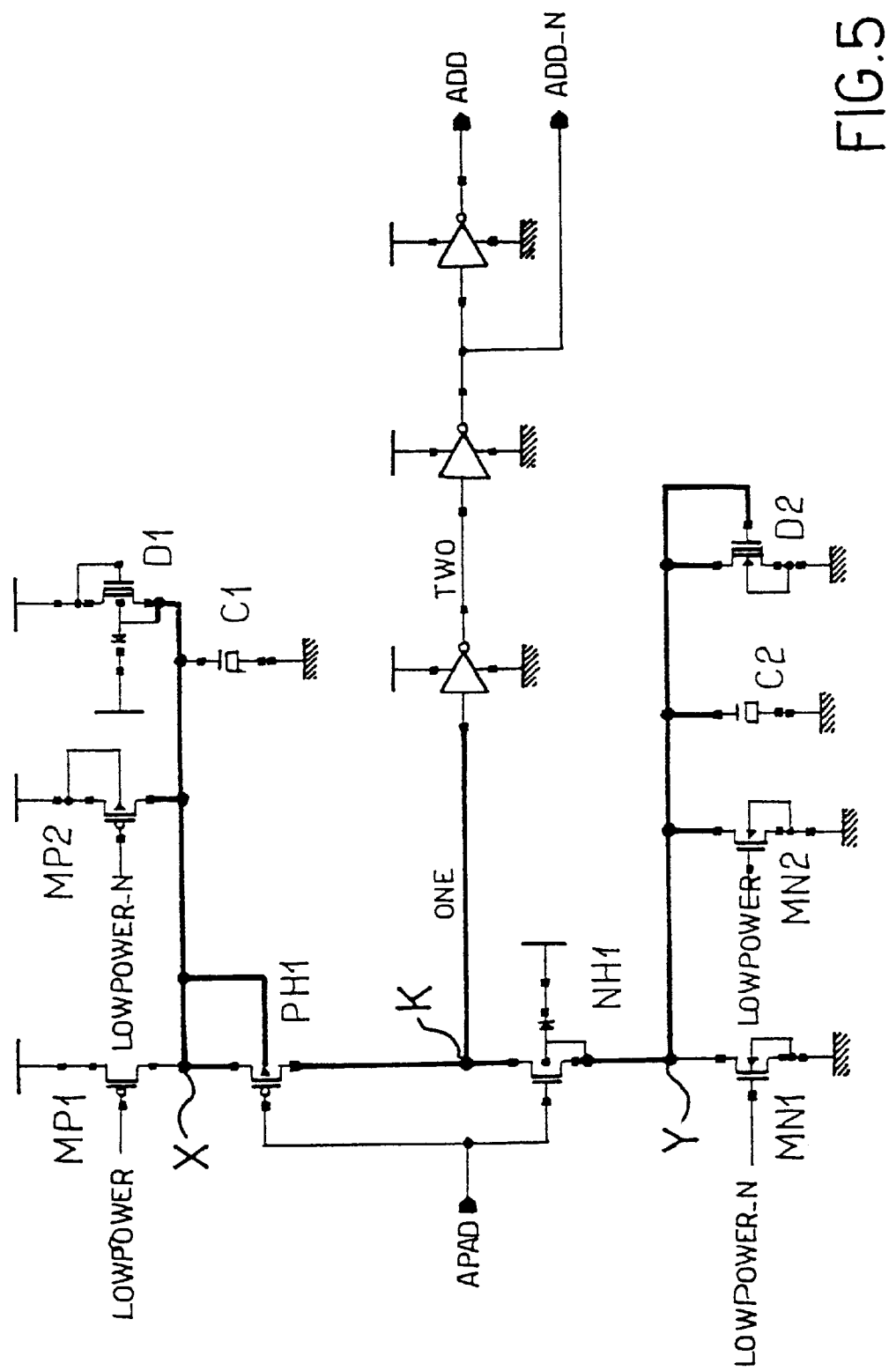

The input inverter 11 is connected to the ground GND and the voltage supply Vcc through two circuit networks, as shown in FIGS. 4 and 5, which act alternatively to each other according to the operating mode of the device.

More particularly, the first of these circuit networks, i.e., the network which is active during normal operation of the stage 10, is drawn in heavier lines in FIG. 4. The transistors MP1 toward the voltage supply Vcc, and MN1 toward the ground GND, are on.

In FIG. 5, the second circuit network is also drawn in heavier lines which is active while the stage 10 is operated in a condition of low consumption. In this case, the transistors MP2 and MN2 are on but less conductive than MP1 and MN1 when they are on.

In other words, with the circuit arrangement of this patent application, the crowbar current flowing through the first TTL inverter 11 in the chain of the input buffer 10 can be limited by suitably selecting which of the supply paths is to be connected to the stage 10.

Transistors PH1 and MH1 are alternatively turned on according to the value of the input TTL signal at the input APAD.

The operating mode is selected by means of the activation signal LOWPOWER, which will be generated internally of the host integrated circuit of the input stage 10.

The signal LOWPOWER is suitably generated upon a predetermined latency period, e.g., 300 nsec, of the inputs being exceeded.

The buffer 10 is still able to switch over while being operated in the low-consumption mode; and it is the very switching of the buffer that will cause the device to be restored to normal operation, by zeroing the signal LOW-POWER.

The embodiment maintains the input buffers 10 operative even while in the low-consumption mode of operation.

The capacitors C1 and C2 associated with the diode-connected low-threshold native transistors, D1 and D2, form parts of the low-consumption bias network shown in FIG. 5.

The roles played by these circuit components can be explained by considering that it will take some time, after the first switching of the input buffer to the low-consumption mode, for the signal LOWPOWER to go over to a zero logic value and the circuit to revert to its normal mode of operation.

During this time, further input switchings might occur; however, a simulation carried out by the Applicants have shown that the transistors MP2 and MN2 would be unable to provide by themselves the current required for a correct buffer output. In other terms, the transistors MP2 and MN2 have been selected intentionally resistive in order to limit the crowbar current, but their resistivity would effectively prevent any subsequent switchings of the buffer before the signal LOWPOWER goes to a zero logic value.

Thus, the capacitors C1 and C2 have been included to act as charge stores, in case the transition of LOWPOWER is slower than expected due to ill-estimated internal delays.

In addition, the native diodes D1 and D2, which are strongly conductive and normally in the 'off' state, are effective to prevent the capacitor C1 from becoming discharged and the capacitor C2 from becoming charged above a given limit, even if no transition of LOWPOWER ever occurs.

Accordingly, the components C1, C2, D1 and D2, while not being strictly necessary, still ensure improved operability of the buffer 10, even in the unfortunate event of the circuit being unable to exit the low consumption condition due to errors in the internal logic network that generates the signal LOWPOWER.

The problem of the margin for noise of the buffer 10 of this invention deserves a final remark.

The specifications for low consumption operation are usually quite stringent dissipation-wise. It is expected that the signal LOWPOWER de-activates most of the circuitry of the CMOS integrated circuit. By actually attenuating the internal noise produced on the power supply and the ground, the integrated circuit would be affected by less noise.

Therefore, it seems reasonable to assume that the margin for noise, as given by the relation $NM_H=2.0-V_{Th(Vcc)}$, will be sufficient.

The inventive circuit could be modified, as regards the normal operation mode, to have the gate of the PMOS transistor MP1 powered from a bias network incorporating a current generator 16.

Figure 6:
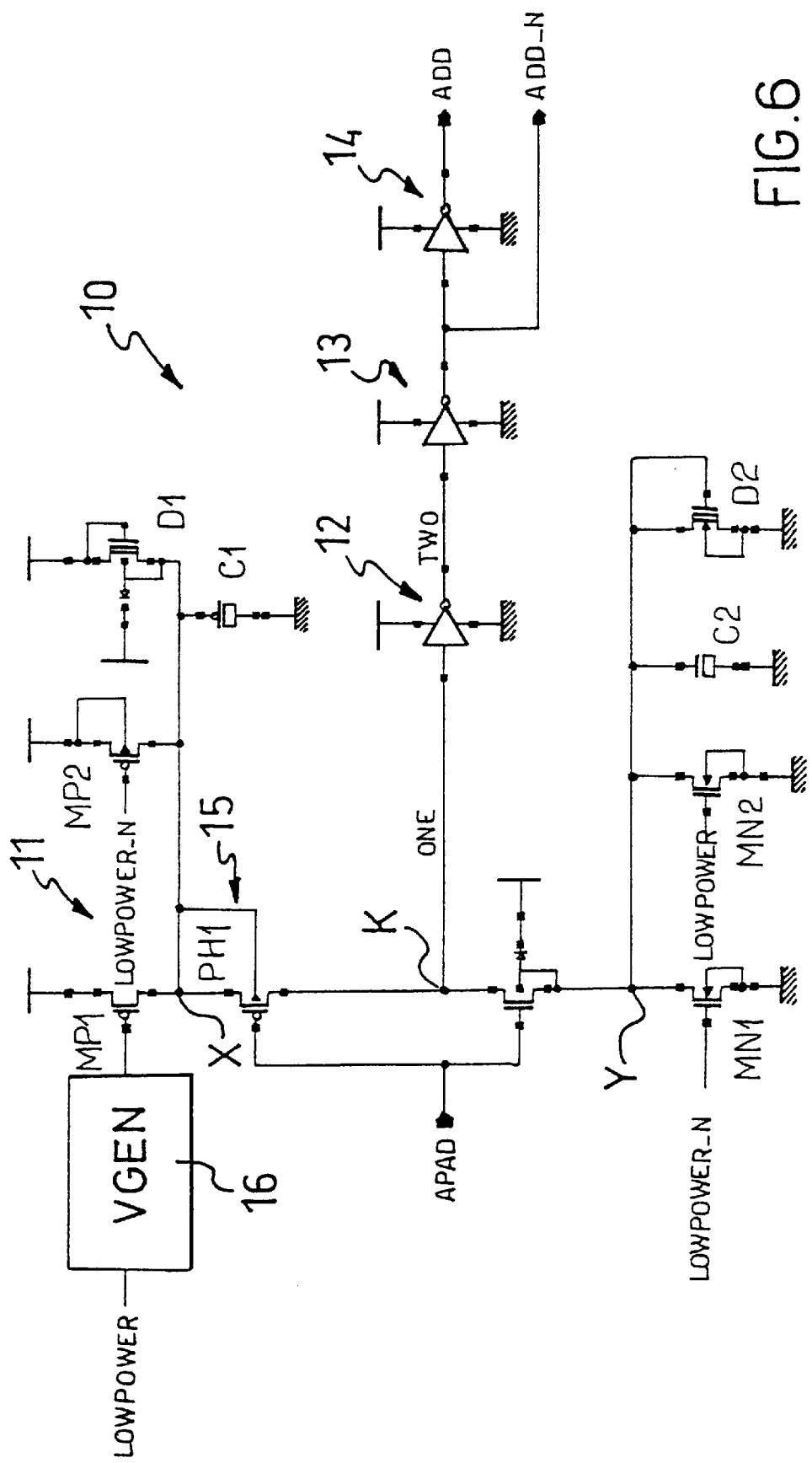
FIG. 6 shows diagramatically a modified embodiment of the buffer stage according to the invention.

This modification is illustrated schematically by FIG. 6, and allows the rise of the buffer 10 threshold as the supply Vcc increases to be reduced.

This may be a welcome modification in that it affords improved flexibility for the normal or high-consumption operation mode.

The input buffer stage of this invention does solve the problem of the prior art circuits, and affords a number of advantages, outstanding among which is that a TTL-CMOS input buffer can be provided which has variable consumption features.

This buffer can be usefull with all those CMOS circuit structures which require TTL-CMOS conversion, and wherein problems of low static consumption of the inputs from the supply are encountered.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A low-consumption TTL-CMOS input buffer stage comprising a chain of inverters cascade connected between an input that receives electric signals at a TTL logic level and an output that produces electric signals at a CMOS logic level, and powered between a first or supply voltage reference and a second or ground reference, wherein a first inverter in the chain includes a means of selecting a delivery path to the buffer stage according to an activate signal for a low-consumption operation mode, wherein said first inverter comprises a complementary first pair of transistors, and that said means comprises a complementary second pair of high-voltage transistors connected between the transistors of the first pair; the first pair of transistors having control terminals respectively receiving said activate signal in a straight form and a negated form; the second pair of transistors having control terminals connected to said input.

2. A buffer stage according to claim 1, wherein the first inverter includes transistors formed in separate wells from the other inverters in the chain.

3. A buffer stage according to claim 1, further comprising a current generator that provides said activate signal to a PMOS pull-up transistor of said first pair.

4. A buffer stage according to claim 1, wherein an interconnection node between the transistors of said second pair is connected to an input of a second inverter in said chain.

5. A buffer stage according to claim 1, wherein said means further comprises a parallel connection of a diode and a PMOS transistor connecting an interconnection node, between a transistor of the first pair and a transistor of the second pair, to said first supply voltage reference.

6. A buffer stage according to claim 1, wherein said means further comprises a parallel connection of a diode and an NMOS transistor connecting an interconnection node, between a transistor of the first pair and a transistor of the second pair, to said second ground voltage reference.

7. A buffer stage according to claim 5, wherein said diode is provided by a triple-well low-threshold native transistor.

8. A buffer stage according to claim 5, further comprising a charge storage capacitor connecting said interconnection node to ground.

9. A buffer stage according to claim 6, further comprising a charge storage capacitor connecting said interconnection node to ground.

10. A low-consumption inverter having an input and an output, comprising:
a first inverter transistor of a first conductivity type having a control terminal coupled to the input of the inverter, a first terminal coupled to a first voltage reference, and a second terminal coupled to the output of the inverter;
a second inverter transistor of a second conductivity type having a control terminal coupled to the input of the inverter, a first terminal coupled to the output of the inverter, and a second terminal coupled to a second voltage reference; and
a controller responsive to a control signal, the controller being structured to activate a high current path between the first inverter transistor and the first voltage reference in response to the control signal being at a first logic state and activate a low current path between the first inverter transistor and the first voltage reference in response to the control signal being at a second logic state, wherein the controller includes a first diode connected between the first terminal of the first inverter transistor and the first voltage reference and a first capacitor connected between the first terminal of the first inverter transistor and the second voltage reference.

11. The inverter of claim 10 wherein the controller includes a second diode connected between the second terminal of the second inverter transistor and the second voltage reference and a second capacitor connected between the second terminal of the second inverter transistor and the second voltage reference.

12. A low-consumption TTL-CMOS buffer stage, comprising:
an output inverter having an input and an output at which a CMOS signal is produced;
an input inverter having an input that receives a TTL signal and an output coupled to the input of the output inverter, the input inverter including:
a first inverter transistor of a first conductivity type having a control terminal coupled to the input of the input inverter, a first terminal coupled to a first voltage reference, and a second terminal coupled to the output of the input inverter;
a second inverter transistor of a second conductivity type having a control terminal coupled to the input of the input inverter, a first terminal coupled to the output of the input inverter, and a second terminal coupled to a second voltage reference; and
a controller responsive to a control signal, the controller being structured to activate a high current path between the first inverter transistor and the first voltage reference in response to the control signal being at a first logic state and activate a low current path between the first inverter transistor and the first voltage reference in response to the control signal being at a second logic state, wherein the controller includes:
  a first control transistor having a control terminal coupled to the control signal, a first terminal coupled to the first voltage reference, and a second terminal coupled to the first terminal of the first inverter transistor, the first control transistor being structured to switch on and form the high current path in response to the control signal being at the first logic state; and
  a second control transistor having a control terminal coupled to the control signal, a first terminal coupled to the first voltage reference, and a second terminal coupled to the first terminal of the first inverter transistor, the second control transistor being structured to switch on and form the low current path in response to the control signal being at the second logic state.

13. The TTL-CMOS buffer stage of claim 12 wherein the controller includes:
  a third control transistor having a control terminal coupled to the control signal, a first terminal coupled to the second terminal of the second inverter transistor, and a second terminal coupled to the first voltage reference, the third control transistor being structured to switch on and form a high current path between the second inverter transistor and the second voltage reference in response to the control signal being at the first logic state; and
  a fourth control transistor having a control terminal coupled to the control signal, a first terminal coupled to the second terminal of the second inverter transistor, and a second terminal coupled to the first voltage reference, the fourth control transistor being structured to switch on and form a low current path between the second inverter transistor and the second voltage reference in response to the control signal being at the second logic state.

14. A low-consumption TTL-CMOS buffer stage comprising:
  an output inverter having an input and an output at which a CMOS signal is produced;
  an input inverter having an input that receives a TTL signal and an output coupled to the input of the output inverter, the input inverter including:
    a first inverter transistor of a first conductivity type having a control terminal coupled to the input of the input inverter, a first terminal coupled to a first voltage reference, and a second terminal coupled to the output of the input inverter;
    a second inverter transistor of a second conductivity type having a control terminal coupled to the input of the input inverter, a first terminal coupled to the output of the input inverter, and a second terminal coupled to a second voltage reference; and
    a controller responsive to a control signal, the controller being structured to activate a high current path between the first inverter transistor and the first voltage reference in response to the control signal being at a first logic state and activate a low current path between the first inverter transistor and the first voltage reference in response to the control signal being at a second logic state, wherein the controller includes a first diode connected between the first terminal of the first inverter transistor and the first voltage reference and a first capacitor connected between the first terminal of the first inverter transistor and the second voltage reference.

15. The TTL-CMOS buffer stage of claim 14 wherein the controller includes a second diode connected between the second terminal of the second inverter transistor and the second voltage reference and a second capacitor connected between the second terminal of the second inverter transistor and the second voltage reference.

16. A low-consumption inverter having an input and an output, comprising:
  a first inverter transistor of a first conductivity type having a control terminal coupled to the input of the inverter, a first terminal coupled to a first voltage reference, and a second terminal coupled to the output of the inverter;
  a second inverter transistor of a second conductivity type having a control terminal coupled to the input of the inverter, a first terminal coupled to the output of the inverter, and a second terminal coupled to a second voltage reference; and
  a controller responsive to a control signal, the controller being structured to activate a high current path between the first inverter transistor and the first voltage reference in response to the control signal being at a first logic state and activate a low current path between the first inverter transistor and the first voltage reference in response to the control signal being at a second logic state, wherein the controller includes:
    a first control transistor having a control terminal coupled to the control signal, a first terminal coupled to the first voltage reference, and a second terminal coupled to the first terminal of the first inverter transistor, the first control transistor being structured to switch on and form the high current path in response to the control signal being at the first logic state; and
    a second control transistor having a control terminal coupled to the control signal, a first terminal coupled to the first voltage reference, and a second terminal coupled to the first terminal of the first inverter transistor, the second control transistor being structured to switch on and form the low current path in response to the control signal being at the second logic state.

17. The inverter of claim 16 wherein the controller includes:
  a third control transistor having a control terminal coupled to the control signal, a first terminal coupled to the second terminal of the second inverter transistor, and a second terminal coupled to the first voltage reference, the third control transistor being structured to switch on and form a high current path between the second inverter transistor and the second voltage reference in response to the control signal being at the first logic state; and
  a fourth control transistor having a control terminal coupled to the control signal, a first terminal coupled to the second terminal of the second inverter transistor, and a second terminal coupled to the first voltage reference, the fourth control transistor being structured to switch on and form a low current path between the second inverter transistor and the second voltage reference in response to the control signal being at the second logic state.

* * * * *

UNITED STATES PATENT AND TRADEMARK OFFICE
CERTIFICATE OF CORRECTION

PATENT NO. : 6,307,396 B1
DATED : October 23, 2001
INVENTOR(S) : Jacopo Mulatti et al.

It is certified that error appears in the above-identified patent and that said Letters Patent is hereby corrected as shown below:

<u>Title page,</u>
Item [73], "STMicroelectronic S.r.l." should read -- STMicroelectronics S.r.l. --.

Signed and Sealed this

Twenty-sixth Day of November, 2002

*Attest:*

JAMES E. ROGAN
*Director of the United States Patent and Trademark Office*

*Attesting Officer*